United States Patent [19]

Mancuso et al.

[11] Patent Number: 5,659,370

[45] Date of Patent: Aug. 19, 1997

[54] FUZZY LOGIC BASED FILTER ARCHITECTURE FOR VIDEO APPLICATIONS AND CORRESPONDING FILTERING METHOD

[75] Inventors: Massimo Mancuso, Monza; Rinaldo Poluzzi, Milan; Gianguido Rizzotto, Civate, all of Italy

[73] Assignees: SGS-Thomson Microelectronics S.r.l., Agrate Brianza; Consorzio per la Ricerca sulla Microelettronica nel Mezzogiorno, Catania, both of Italy

[21] Appl. No.: 427,081

[22] Filed: Apr. 21, 1995

[30] Foreign Application Priority Data

Apr. 27, 1994 [EP] European Pat. Off. ............ 94830196

[51] Int. Cl.⁶ .................. H04N 5/21; H04N 5/213
[52] U.S. Cl. .............. 348/620; 348/618; 364/724.13; 395/900; 382/260
[58] Field of Search ................... 348/618, 619, 348/620, 622, 623, 609, 627; 395/900; 364/724.01, 724.17, 724.1; 382/260, 265; H04N 5/21, 5/213

[56] References Cited

U.S. PATENT DOCUMENTS 4,809,069  2/1989  Meyer et al. ............... 358/166
5,285,279  2/1994  Sakamoto et al. .......... 348/614

FOREIGN PATENT DOCUMENTS 0488033  6/1992  European Pat. Off. .
0497221  8/1992  European Pat. Off. .

OTHER PUBLICATIONS

Wang et al., An RLS Fuzzy Adaptive Filter, With Application to nonlinear channel equalization., Jul. 1993, pp. 895–900.

Yamakawa et al., Harware Implementation of Fuzzing Filtering, Apr. 1993, pp. 535–542.

European Search Report for European Patent Application Number 94 83 0196 filed Apr. 27, 1994.

Patent Abstracts of Japan, vol. 17, No. 545 (E-1442) Sep. 30, 1993 & JP-A-05 153 563 Matsushita.

Patent Abstracts of Japan, vol. 17, No. 437 )E-1413) Aug. 12, 1993 & JP-A-05 091 532 Toshiba.

*Primary Examiner*—Michael H. Lee
*Attorney, Agent, or Firm*—Wolf, Greenfield & Sacks, PC; James H. Morris

[57] ABSTRACT

A filter architecture for high-resolution video applications of the type comprising at least one filter block having a plurality of digital inputs which receive through an interface components of a television signal and some outputs through which to take the result of a filtering operation for noise associated with the television signal also comprises in the filter block at least one interpolator block connected to said inputs and operating with fuzzy logic to execute a television signal scanning conversion to be presented on additional outputs of the filter block.

11 Claims, 7 Drawing Sheets

FUZZY LOGIC BASED FILTER ARCHITECTURE FOR VIDEO APPLICATIONS AND CORRESPONDING FILTERING METHOD

BACKGROUND OF THE INVENTION

1. Field of the Invention

The present invention relates to a circuit architecture for video applications and in particular to a filter architecture for video signals. The present invention concerns also a filtering method for television signals. Specifically the present invention concerns a filter architecture for high-resolution video applications of the type comprising at least one filtering block having a plurality of digital inputs which receive, through an interface, components of a three-dimensional television signal and some outputs through which to take the result of a filtering operation for reducing the noise associated with the television signal.

2. Discussion of the Related Art

Television receiver image quality improvement is correlated on the one hand with the capability of reducing the noise accompanying the video frequency signal and on the other hand with the reduced signal band amplitude.

Noise is an inherent characteristic of any telecommunications system or television signal transmission network and can arise in many different manners. For example, the signal source can be also a source of noise which is generated in a camera. The electronic circuitry designed for conveyance of the signal adds, in general, noise such as in video recorders. In addition, the signal is sent to the transmitters through a distribution network and broadcast through antennas. These last components also add more noise to that already present in the video signal.

The noise can be reduced by using different filtering methods which are chosen on the basis of the characteristics of the noise to be filtered. For example, a median filter for impulsive noise or a recursive filter for Gaussian noise give good results with an acceptable cost/performance relationship.

On pages 257–276 of the text "Digital filtering of television signals" are discussed some of the techniques presently most used for reducing video signal noise. Although advantageous in some ways, these techniques do not yet achieve good filtering by means of adaptive procedures.

In addition, as already mentioned, the other problem limiting the good quality of video signals is the reduced amplitude of the signal band. It is recalled that the television signal is a three-dimensional signal having two spatial dimensions, one horizontal and the other vertical, and a third temporal dimension which allows reconstruction of the movement of the scene taken and then reproduction of moving images. We shall define below as an image field an assembly of rows which make up a television image in a given time period. The problem of limited band amplitude must be considered with reference to the three dimensions of the signal.

It is known that an improvement in the spatial resolution of the video image can be achieved with spatial filtering which adds a peaked signal to the original signal. An improvement in the time resolution is achieved through interpolation algorithms. In any case, the circuitry architectures which allow video signal resolution improvement must perform a spatial or space-temporal filtering of the signal.

The filtering performed allowing only for the spatial information is executed with interpolation algorithms called 'intrafield' because they make use of the information present in the same image field. The algorithms which make use of the information present in two consecutive image fields detecting the presence of movement (space-time filtering) are termed 'interfield'.

Temporal resolution can be increased, even doubling the image field frequency, by means of a Scanning Rate Converter (SCR). As an alternative the temporal resolution can be increased by doubling the line frequency of an image field.

But in all cases, whether noise filtering or video image filtering, low-pass filters are normally used. In this manner, however, the contours of the objects in the image are shaded or attenuated and it becomes necessary to use additional and costly directional filters which supply a remedy for this shortcoming. The low-pass recursive filters also attenuate the high temporal frequencies correlated with the movement content of the image sequences. These filters should thus have a behavior such that when a movement is detected no filtering is done.

In these cases it would be desirable to be able to associate with the filter architecture a movement detector.

Indeed, if we consider the pixel belonging to a static region of the video image it can be reproduced without filtering so as to safeguard the display resolution. But if the pixel belongs to a moving image region it is the interpolated value of said pixel which will have to be displayed.

SUMMARY OF THE INVENTION

The present invention provides a filter architecture and related filtering method which, through the use of fuzzy logic, is adaptive, i.e., capable of filtering effectively images with noise reduction problems and space-time resolution problems. In particular, an architecture in accordance with the present invention includes a first circuit portion for noise reduction and a second circuit portion for simultaneous television signal scanning conversion.

Accordingly, one aspect of the present invention is a device including at least one filter block having a plurality of digital inputs which receive components of a video signal and outputs providing a filtered video signal with reduced noise. At least one interpolator block is also connected to said plurality of digital inputs and operates with fuzzy logic procedures to execute a video signal scanning conversion using interpolation and having an output providing the interpolated video signal.

Another aspect of the present invention is a method for filtering a video signal codified in digital form. Recursive noise filtering of the video signal is performed. Simultaneously, fuzzy logic inference operations are performed on the video signal. Scanning rate conversion of the video signal is performed using an interpolation process selected according to the performed fuzzy logic inference operations.

BRIEF DESCRIPTION OF THE DRAWINGS

Characteristics and advantages of the filter architecture and related filtering method in accordance with the present invention are set forth in the description of an embodiment thereof given below by way of example and not of limitation with reference to the annexed drawings, in which.

DETAILED DESCRIPTION

Figure 1A:
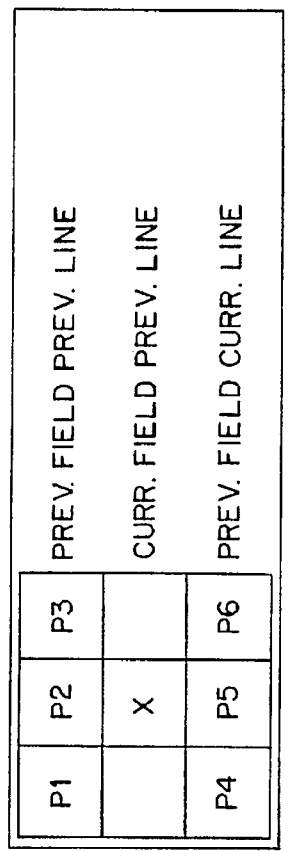
FIG. 1A shows schematically a so-called work window of the filter in accordance with the present invention.
Figure 1:
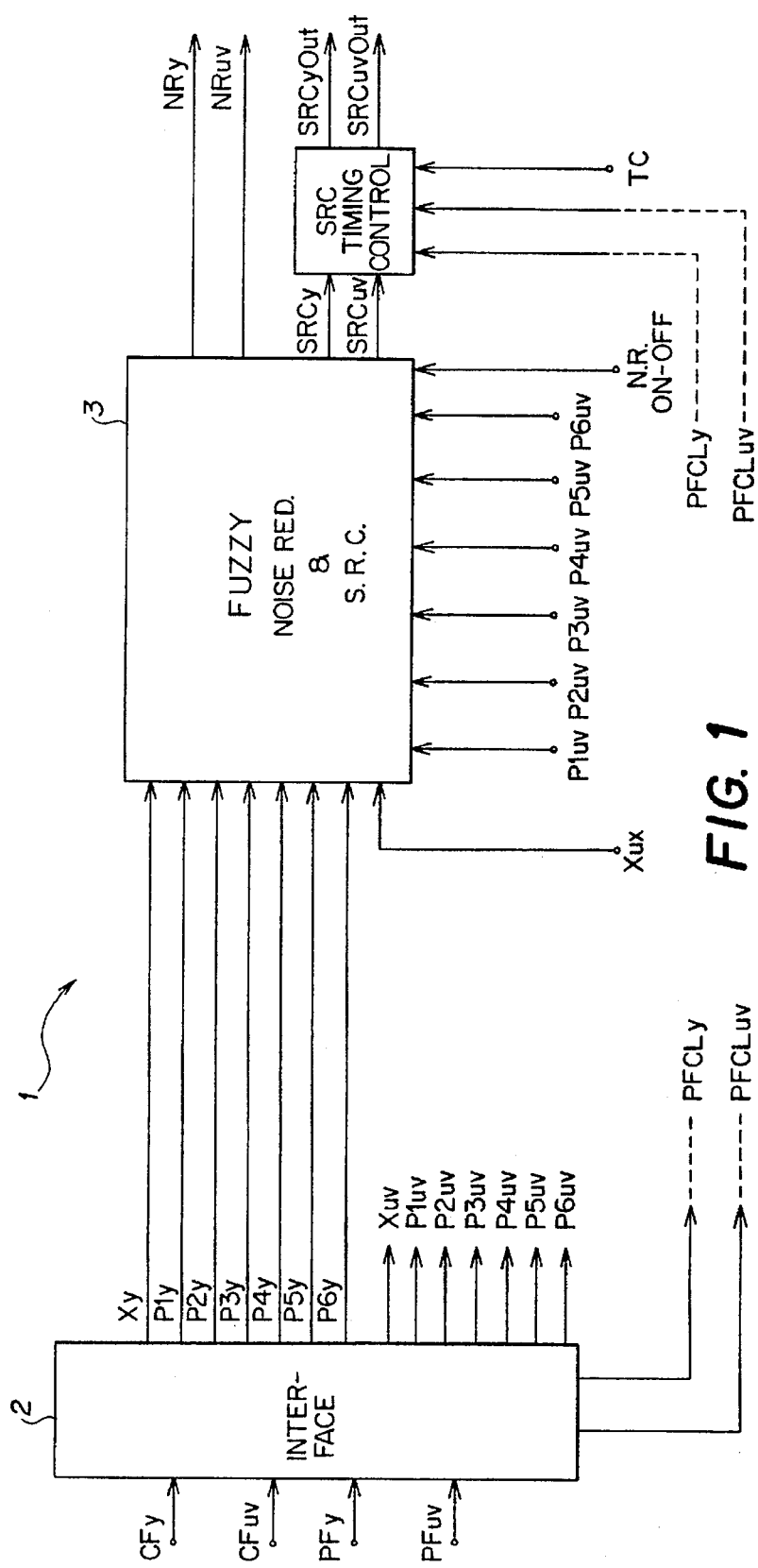
FIG. 1 shows a schematic view of a filter architecture provided in accordance with the present invention.

Referring now to FIG. 1, reference number 1 represents schematically as a whole a filter architecture provided in accordance with the present invention to perform both a Gaussian noise reduction and a scanning rate conversion of a television signal.

The television signal comprises components U, V and Y each of which is codified with one byte (8 bits).

The architecture 1 is equipped with at least six digital inputs of which four are data inputs CFy, CFuv, PFy and PFuv while the remaining two are control inputs indicated by the symbols NR and TC.

Specifically the inputs CFy and CFuv are the sample signals of luminance/chrominance for a current image field while the inputs PFy and PFuv are the corresponding immediately preceding image field signals. Basically these data identify a work window or image window centered in a pixel x to be processed as shown in FIG. 1A.

All of these inputs belong to an interface 2 which has a plurality of outputs Xy, Ply, Xuv and Piuv directly connected to a filter 3 operating with fuzzy logic procedures. To this filter 3 is applied the control signal NR.

Another pair of outputs PFCLy, Pfcluv of the interface 2 is connected to corresponding inputs of a timer block SRC which also receives signals from the filter 3 through respective outputs SRCy and SRCuv which present the result of the scanning rate conversion operation. To the timer block SRC is applied the control signal TC.

Another pair of outputs NRy, NRuv of the filter 3 allows taking of the Gaussian noise filtering operation result.

Figure 2:
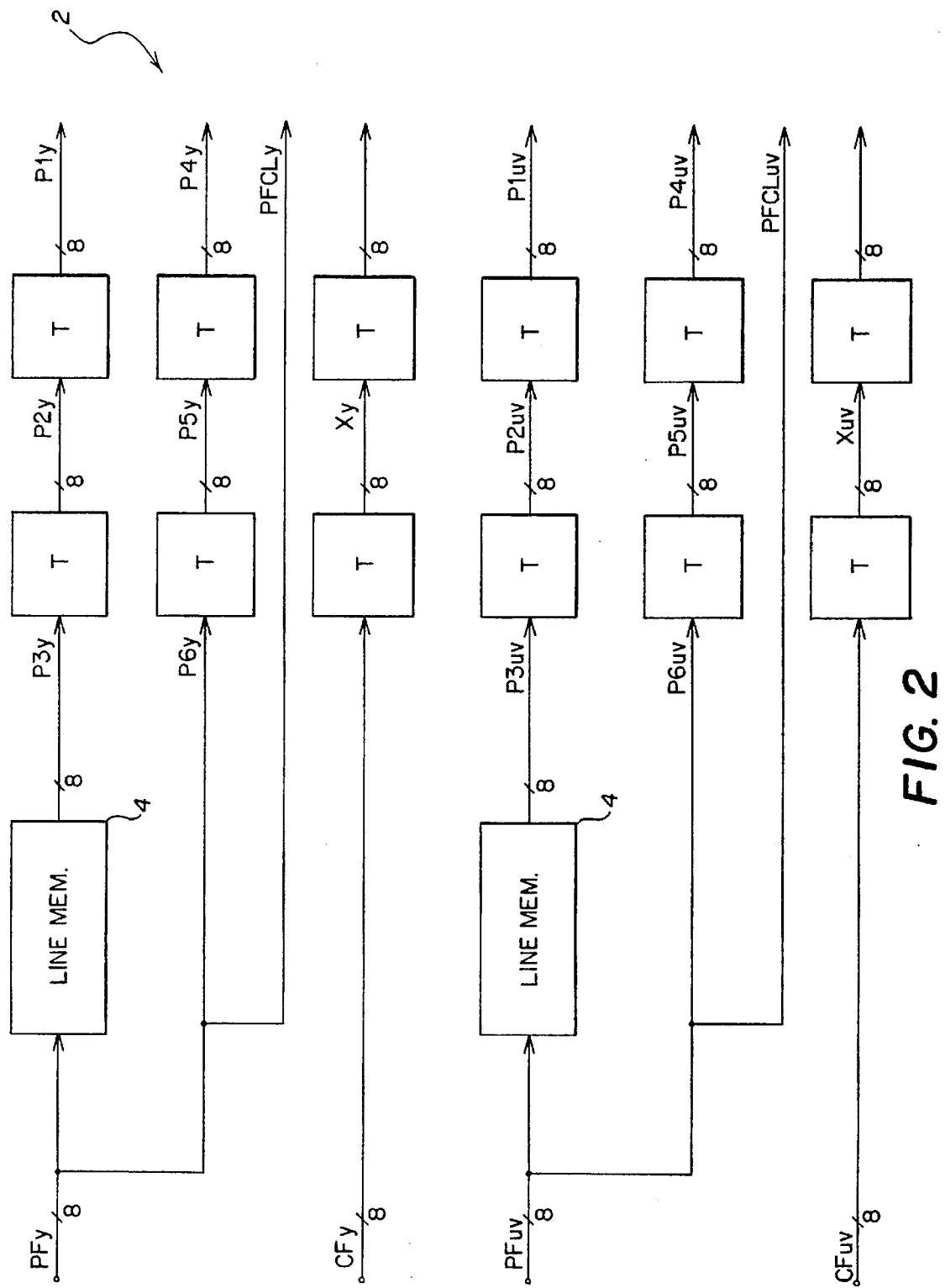
FIG. 2 shows in detail a schematic view of a detail of the filter architecture of FIG. 1.

FIG. 2 shows in greater detail the internal structure of the interface 2.

As shown in said FIG. 2, the interface 2 includes line memories 4 and delay blocks T. A line memory 4 is associated with each type PF input while the delay blocks T allow taking a series of identical signals each of which is sequentially delayed in relation to the preceding one by a predetermined time period T. Said signals constitute the outputs Piy and Piuv of the interface 2.

The inputs Pfy and Pfuv of the interface 2 are directly connected to the respective outputs PFCLy and PFCLuv. The outputs Xy and Xuv correspond to the inputs CFy and CFuv but are delayed by means of a single block T.

Figure 3:
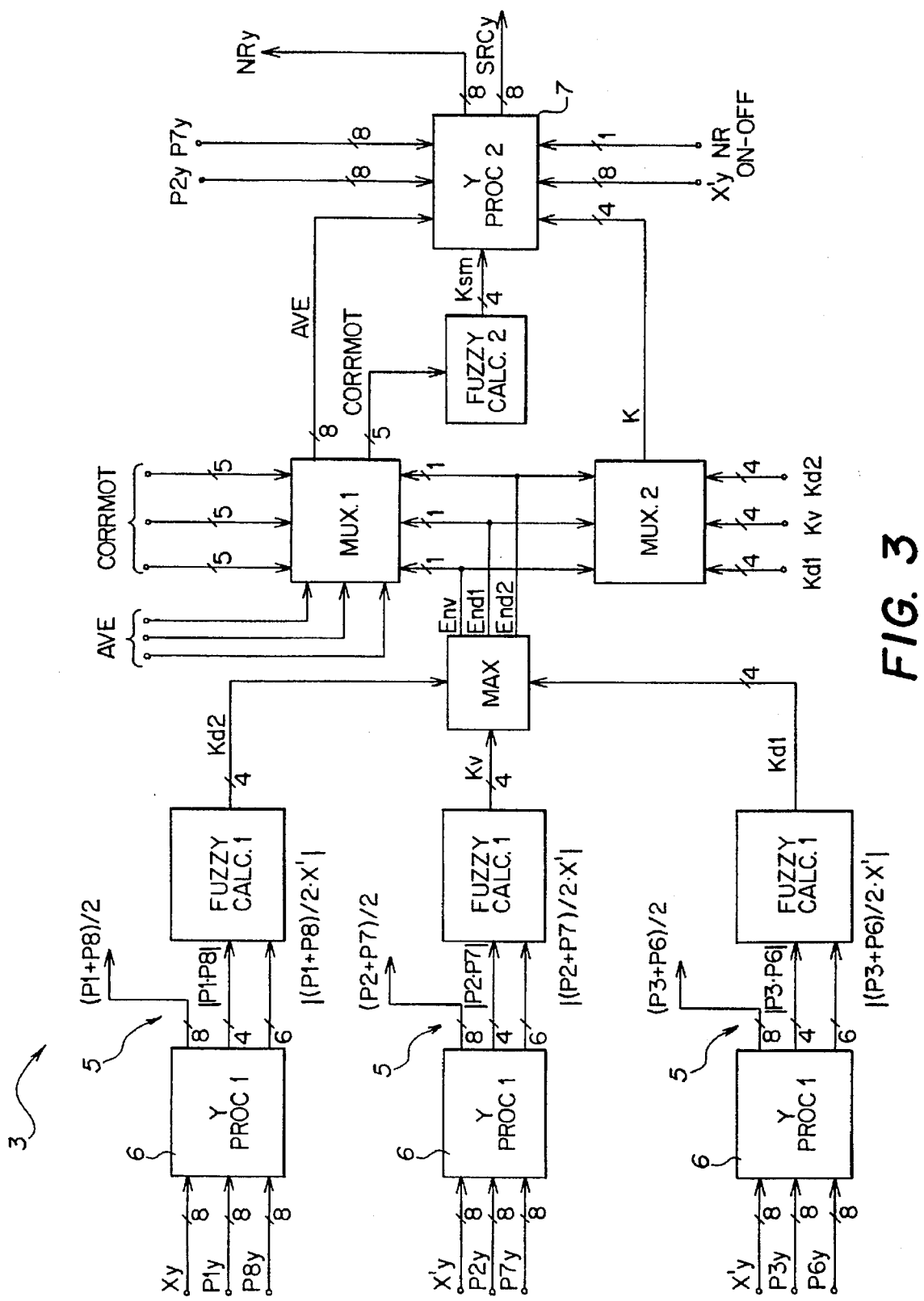
FIG. 3 shows in detail a schematic view of a filter block inserted in the filter architecture of FIG. 1.

Now with particular reference to the example of FIG. 3 there is described in detail the internal structure of the filter 3.

This portion of the architecture 1 operates on the luminance components (luma) of the video signal on the basis of a method in accordance with an embodiment of the present invention and uses fuzzy logic signal processing criteria. It should be noted that the luminance contains the luminosity information associated with the image.

The chrominance component (chroma) associated with the details of an image is processed by a second circuit portion which is discussed below with reference to FIG. 6.

Therefore, the first portion shown in FIG. 3 processes the luminance component associated with a video image, i.e. the part in shades of grey of the image.

A plurality of parallel branches 5 each incorporating an arithmetic block 6 indicated also by the symbol Y PROC1 are provided to receive each signals Xy and Piy. A calculation block CALC1 is connected in cascade to the preceding arithmetic block 6 and is designed to execute fuzzy logic inference operations. The structure of the calculation block CALC1 is conventional insofar as it executes inference operations among logical variables received at input according to fuzzy logic. The particular inference operations it performs are described below.

The arithmetic block 6 executes arithmetic operations on the pixels, Pi, Pj and X to calculate a series of parameters indicated below by the symbols Corr, CorrMot and Ave. Corr is the module of the difference between Pi and Pj: Corr=Pi−Pj. CorrMot is the modulo of the difference between the value (Pi+Pj)/2 and the signal X: CorrMot= (Pi+Pj)/2−X. Ave is the weighted average of Pi and Pj: Ave=(Pi+Pj)/2.

Figure 4:
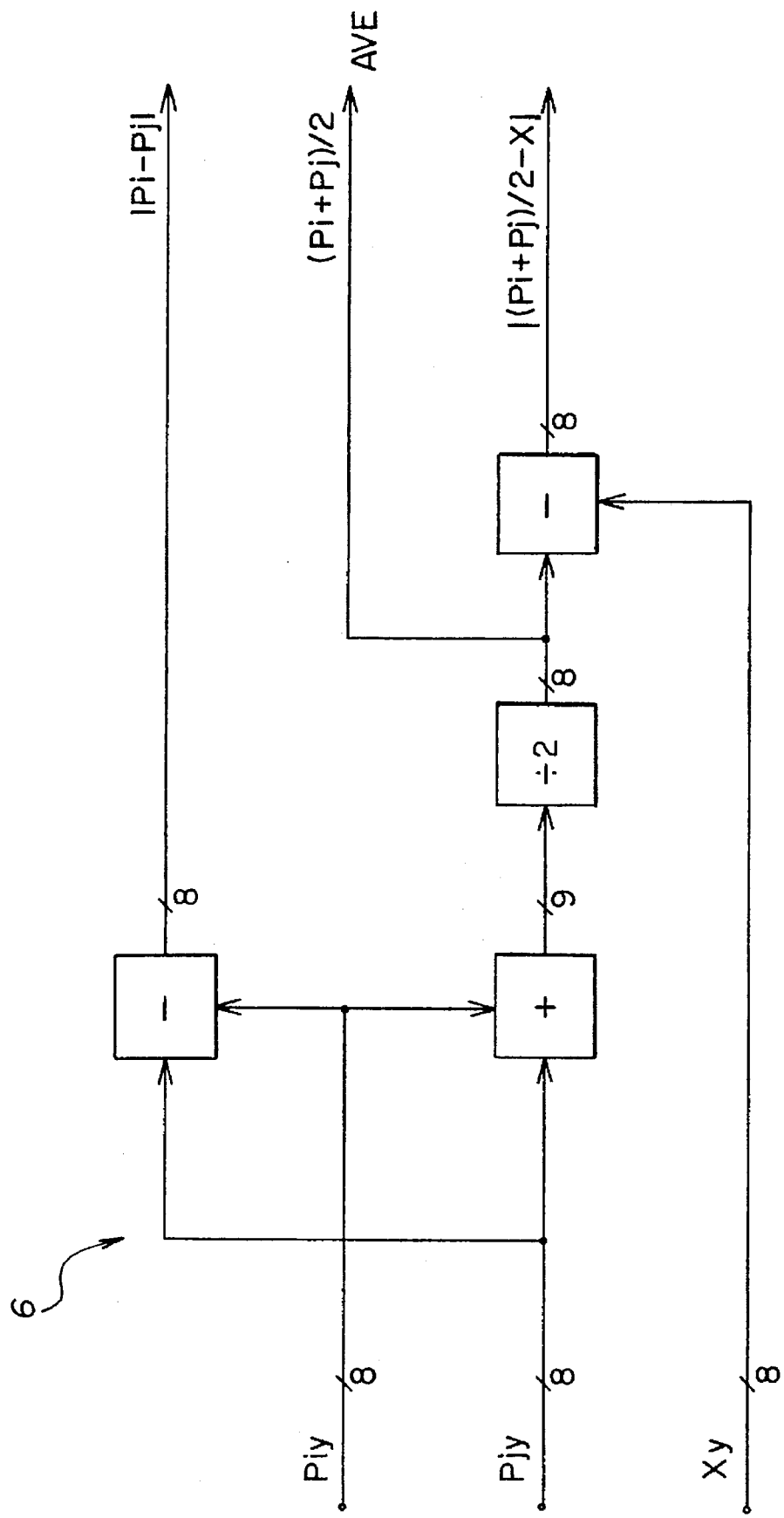
FIG. 4 shows the internal structure of a detail of the example of FIG. 3.

FIG. 4 shows schematically the structure of this arithmetic block 6.

The branches 5 all lead to a block MAX which takes the highest value among all those received at input. Depending on which of the values received at input is the highest, the block MAX selects one of its own outputs Env, End1 or End2 and enables a corresponding output line.

Each of these output lines provides a T branch which connects together bidirectionally two multiplexers MUX1 and MUX2 whose job is to select parameters for the highest correlation direction.

From the first MUX1 of said multiplexers are output the values CorrMot and Ave the first of which is applied at input to a second fuzzy logic calculation block CALC2 while the second is supplied to a second arithmetic block 7 indicated also by the symbol PROC2.

Also, the second calculation block CALC2 executes, using fuzzy logic, inference operations which are described below.

Figure 5:
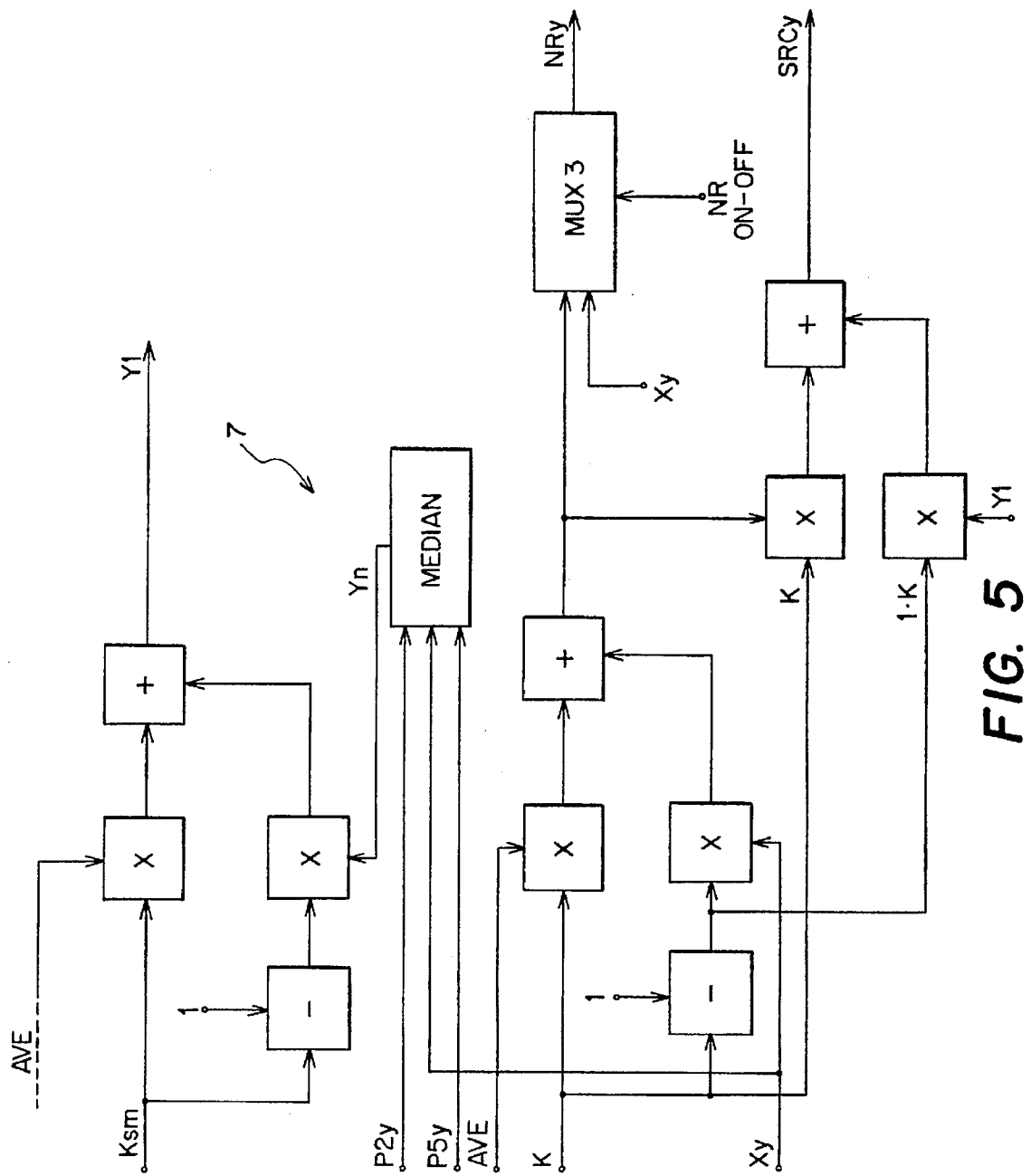
FIG. 5 shows the internal structure of a second detail of the example of FIG. 3.

The structure of the second arithmetic block 7 is shown in FIG. 5 and the arithmetic operations which are executed in it are discussed below with reference to the filtering method in accordance with the present invention.

Figure 6:
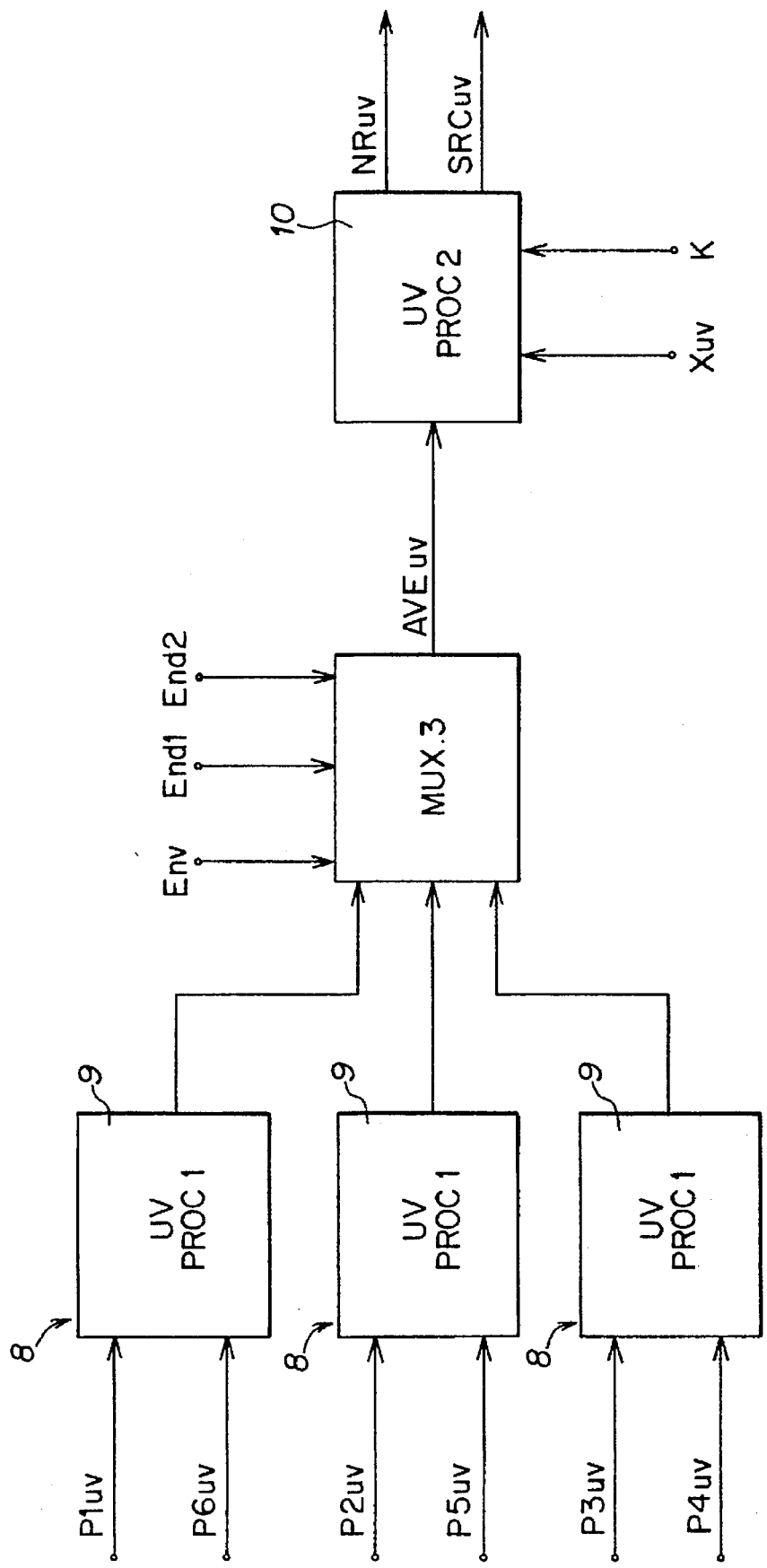
FIG. 6 shows a schematic view of another portion of the filter block inserted in the filter architecture of FIG. 1.

FIG. 6 shows the portion of the filter 3 which operates on the chrominance component (chroma) and performs a scanning rate conversion and video signal noise reduction. This portion provides at input a plurality of parallel branches 8 each incorporating an arithmetic block 9 indicated also by the symbol UV PROC1.

The arithmetic block 9 executes a series of arithmetic operations on the values Knr and Xuv to calculate a parameter indicated below by AVEuv=(Piuv+Pjuv)/2.

The branches 8 all lead to a selector block MUX3 which selects the value received at input having the highest correlation. This value is transmitted to another arithmetic block 10 indicated also by the symbol UV PROC2.

Figure 7:
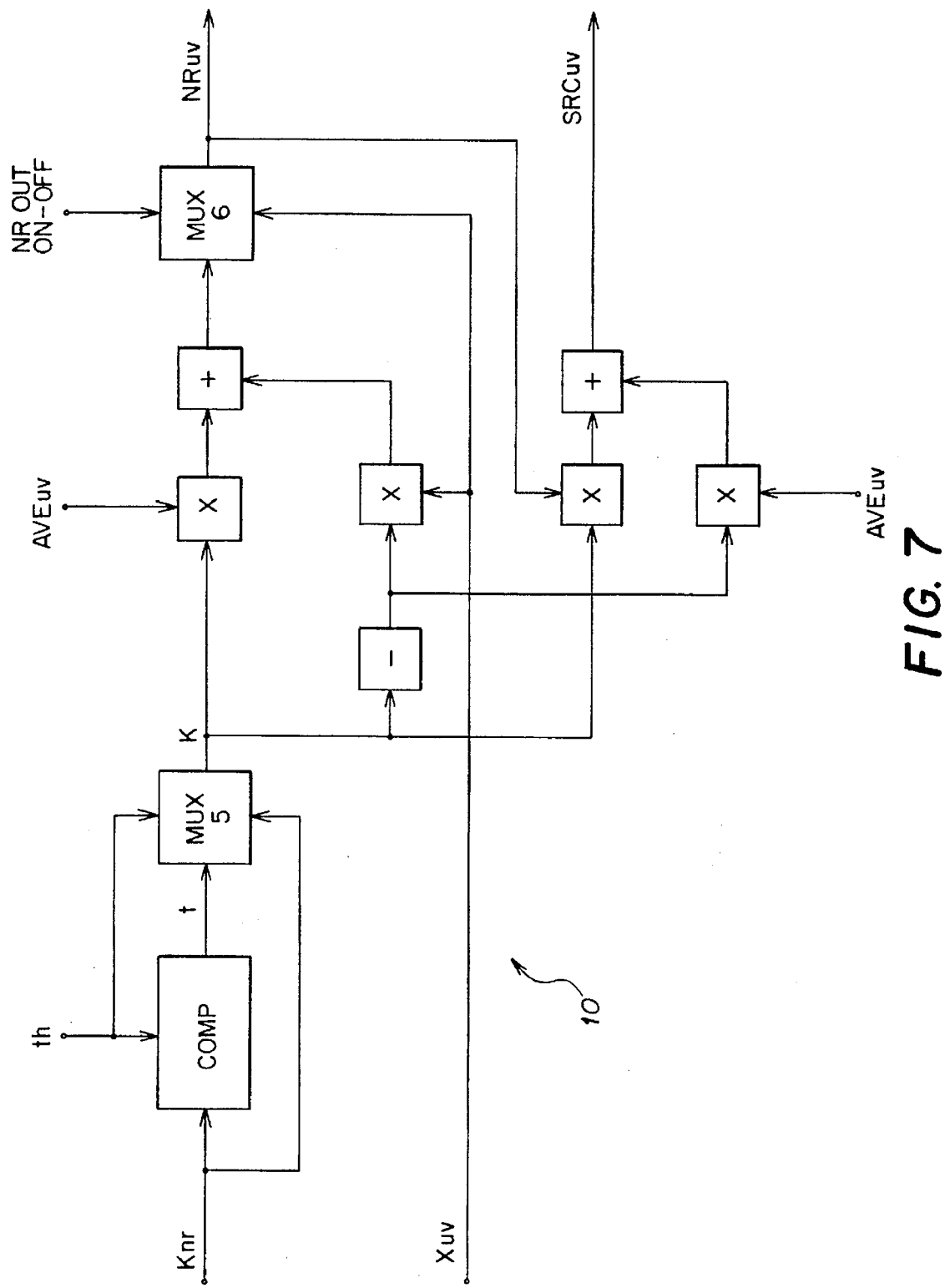
FIG. 7 shows a schematic view of a detail of the portion of FIG. 6.

FIG. 7 shows schematically the structure of this arithmetic block 10. It should be noted that the value K used for processing the chrominance is the output of the processing of the fuzzy logic calculation block CALC1 on the component Y of the signal.

Inside the block 10 is provided a comparison with a threshold value th which is executed in the block COMP because the highest value of K for chrominance processing is less than the corresponding value in the luminance processing.

A filtering method in accordance with the present invention will now be described with reference to FIG. 1A and to an initial state in which the digital codes of the individual pixels of a current image field and an immediately preceding image field are presented at the input of the interface 2.

As mentioned above, the method and architecture in accordance with the present invention allow Gaussian noise reduction and television signal scanning conversion.

Noise reduction is discussed first.

The digitized luminance component CFy, PFy associated with an image to be processed is one of the inputs for the filter architecture 1.

The work window shown in FIG. 1A comprises nine pixels. The first and last rows of the window belong to the preceding image field. Only the central pixel x belongs to the current image field and is thus the pixel to be processed.

This assumes that the Gaussian noise is correlated spatially much more than temporally.

Therefore, the two lines of the preceding image field are used to filter the current one in accordance with the following formula.

$$y_{nr}=k_{nr}*(Pi+Pj)/2+(1-k_{nr})*x \quad (1)$$

where $y_{nr}$ is the filtered pixel while $k_{nr}$ is 0 if the pixel is in motion and 1 if the pixel is static. Pi and Pj are normally the pixels P2 and P5. However, to improve the filtering performance for the edge attenuation Pi and Pj are the pixels along the direction with the higher degree of correlation.

Now making use of the fuzzy logic inference rules the filter 3 is capable of detecting directly both the movement and the video image edge.

Through the use of fuzzy logic inference operations are performed in the calculation block CALC1. These inference operations are generally configured as IF-THEN rules with at least one initial or antecedent preposition and at least one consequent implication.

The parameters Corr and CorrMot, evaluated in the vertical and diagonal directions of the work window as shown in FIG. 4, are chosen as antecedent prepositions. For example, P1 to P6, P2 to P5 or P3 to P4. The value $K_{nr}$ derived therefrom will be in the range [0, 1].

The inference rules used in the calculation block CALC1 are the following type.

IF Corr is (low, high) AND CorrMot is (low, High)
THEN $K_{nr}$ is (high, low)

After the fuzzy logic processing has been applied to find a value of $K_{nr}$ in each direction the highest value is selected in the block MAX and the corresponding direction is in turn selected.

Now scanning conversion is discussed.

As concerns scanning conversion there can be executed a processing very similar to that of the above formula (1) to determine the pixel to be interpolated. Indeed, if the pixel is static, the output of the interpolator would supply the current pixel or, as an alternative, the mean value along an edge.

Therefore:

$$y_{src}=k_{src}*(Pi+Pj)/2+(1-k_{src})*x \quad (2)$$

where $K_{src}$ is 1 when the pixel is in motion or 0 when it is static. Additionally, $$K_{src}=1-k_{nr}$$

and hence the formula (2) can be rewritten as:

$$y_{src}=k_{nr}*x+(1-k_{nr})*(Pi+Pj)/2 \quad (3)$$

It is generally best to substitute the original pixel x with the output $y_{nr}$ found following noise reduction so that the interpolation is executed on noiseless pixels.

There is thus found the following relationship.

$$y_{src}=k_{nr}*y_{nr}+(1-k_{nr})*(Pi+Pj)/2 \quad (4)$$

It should be noted that when the central pixel lies on a line separating two regions with different grey levels the fuzzy logic processing will detect a moving pixel although it is actually static. This fact introduces an edge attenuation effect.

This possible shortcoming is overcome by the subsequent fuzzy logic processing done by the calculation block CALC2 which acts on the parameter CorrMot and produces a new parameter $k_{sm}$ whose value is in the range [0, 1]. The latter value is a soft switch between the parameter Ave and the mean value of (p2, P5, x).

The formula deriving therefrom is processed inside the block PROC2 of FIG. 5 and is the following.

$$y_I=k_{sm}*(Pi+Pj)/2+(1+k_{sm})*Median(P2, P5, x) \quad (5)$$

The inference rules of the calculation block CALC2 which lead to evaluation of the parameter $k_{sm}$ are the following.

IF CorrMot is high THEN $K_{sm}$ is high

The final processing which allows finding the result of the interpolation is the following.

$$y_{src}=k_{nr}*y_{nr}+(1-k_{nr})*y_I \quad (6)$$

As concerns the chrominance component (chroma) the processing is very similar to the previous ones. In particular the following formulas are utilized.

$$UV_{nr}=k_{nr}*(Piuv+Pjuv)/2+(1-k_{nr})*xuv \quad (7)$$

This formula (7) is suitable for the noise reduction phase while for the interpolation the following is suitable.

$$UV_{src}=k_{nr}*UV_{nr}+(1-k_{nr})*(Piuv+Pjuv)/2$$

Clearly Piuv and Pjuv are the pixels along the direction of highest correlation.

It should be recalled however that the blocks CALC1 and CALC2 operate with fuzzy logic only on the luminance component.

One advantage of this invention is that the mean recursive filtering is actually the adaptive type. Additionally, it is possible to accurately read both movement and the image field edges with good spatial and temporal adaptation.

Experimental tests performed by the applicant have given promising results in terms of overall performance in comparison with prior methodologies.

In addition, only a small amount of circuitry is used to provide both noise reduction and scanning rate conversion in comparison with conventional circuitry which allows only noise reduction by known techniques.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is byway of example only and is not intended as limiting. The invention is limited only as defined in the following claims and the equivalents thereto.

What is claimed is:

1. A device for filtering a television signal, comprising:
   a fuzzy logic calculation block having a plurality of inputs for receiving components of the television signal and operating with fuzzy logic procedures applied to the received components to provide an output indicative of a direction of highest correlation of two consecutive image fields in the interlaced television signal; and
   a filter having inputs connected to the plurality of inputs of the fuzzy logic calculation block for receiving the components of the television signal and having a first set of outputs for providing a noise-reduced television signal according to the output of the fuzzy logic calculation block and having a second set of outputs for providing a scan-converted television signal according to the output of the fuzzy logic calculation block.

2. The device of claim 1, wherein the fuzzy logic calculation block comprises:
   a plurality of parallel branches, wherein each parallel branch is connected to a subset of the plurality of inputs, wherein each branch comprises an arithmetic block having outputs for providing a correlation of the two consecutive image fields in a direction; and
   a fuzzy logic circuit having inputs connected to the outputs of the arithmetic blocks of the parallel branches and an output indicating the direction of highest correlation of the two consecutive image fields.

3. The device of claim 2, wherein the fuzzy logic circuit performs inference operations using as antecedent prepositions the correlations calculated by the arithmetic block.

4. The device of claim 2, further comprising:
   at least one multiplexer for selecting values for an operation to be performed by the filter; and
   a second arithmetic block having inputs connected to the outputs of the arithmetic blocks of the plurality of parallel branches, wherein the second arithmetic block calculates a highest value among the inputs and enables respective output lines connected to the at least one multiplexer.

5. The device of claim 4, further comprising a second fuzzy logic calculation block connected to the multiplexer for generating values for an operation performed by the filter according to fuzzy logic inference operations performed on values selected by the multiplexer.

6. The device of claim 5, wherein the filter comprises a second arithmetic block having inputs connected to receive values selected by the multiplexer and inputs connected to values generated by the second fuzzy logic calculation block, and for performing noise reduction and scan rate conversion on the received components of the television signal according to the received values.

7. The device of claim 2, further comprising a second circuit having inputs for receiving a chrominance component of the television signal, and outputs for providing scan rate converted and noise reduced components according to fuzzy logic inference operations applied to the inputs.

8. A method for filtering a television signal, comprising the steps of:
   receiving components of the television signal;
   performing fuzzy logic inference operations on the received components to determine a direction of highest correlation of two consecutive image fields in the television signal;
   performing recursive noise filtering on the received components according to the determined direction of highest correlation; and
   interpolating the components of the television signal to perform scan rate conversion of the television signal according to the determined direction of highest correlation.

9. The method of claim 8, wherein the step of interpolating is performed on a luminance component of the television signal.

10. The method of claim 8, wherein the step of performing fuzzy logic operations includes the step of detecting movement and edges in two consecutive fields of the television signal and determining a direction of highest correlation of edges and motion.

11. The method of claim 8, wherein the step of detecting movement and edges comprises the step of analyzing a set of at least nine pixels of the television signal in the plurality of directions and wherein the detected movement and edges are used in antecedent prepositions of the performed fuzzy logic operations.

* * * * *